(12) United States Patent
Tsai et al.

(10) Patent No.: US 9,252,002 B2
(45) Date of Patent: Feb. 2, 2016

(54) TWO PIECE SHUTTER DISK ASSEMBLY FOR A SUBSTRATE PROCESS CHAMBER

(75) Inventors: Cheng-Hsiung Matthew Tsai, Cupertino, CA (US); Ananthkrishna Jupudi, Milpitas, CA (US); Robert Dinsmore, Sunnyvale, CA (US); Song-Moon Suh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 187 days.

(21) Appl. No.: 13/550,997

(22) Filed: Jul. 17, 2012

(65) Prior Publication Data

US 2014/0020629 A1    Jan. 23, 2014

(51) Int. Cl.
*C23C 14/00* (2006.01)
*H01J 37/34* (2006.01)

(52) U.S. Cl.
CPC ............ *H01J 37/3447* (2013.01); *H01J 37/34* (2013.01); *C23C 14/0068* (2013.01)

(58) Field of Classification Search
CPC .................... H01J 37/3447; C23C 14/0068
See application file for complete search history.

(56) References Cited

U.S. PATENT DOCUMENTS

| 5,358,615 | A | 10/1994 | Grant et al. | |
|---|---|---|---|---|
| 6,045,670 | A | 4/2000 | Adams et al. | |
| 6,824,627 | B2 | 11/2004 | Dhindsa et al. | |
| 8,211,324 | B2 | 7/2012 | Dhindsa et al. | |
| 2004/0245098 | A1* | 12/2004 | Eckerson | 204/298.01 |
| 2007/0032081 | A1 | 2/2007 | Chang et al. | |
| 2009/0130336 | A1* | 5/2009 | Dekempeneer et al. | 427/569 |
| 2009/0142512 | A1 | 6/2009 | Forster et al. | |
| 2009/0173446 | A1 | 7/2009 | Yang et al. | |
| 2010/0071625 | A1 | 3/2010 | Brown | |
| 2010/0326818 | A1* | 12/2010 | Ikemoto et al. | 204/192.17 |
| 2011/0126984 | A1 | 6/2011 | Kang et al. | |
| 2012/0103793 | A1* | 5/2012 | Fujii | 204/192.1 |

OTHER PUBLICATIONS

International Search Report and Written Opinion mailed Sep. 25, 2013 for PCT Application No. PCT/US2013/050490.

* cited by examiner

*Primary Examiner* — Keith Hendricks
*Assistant Examiner* — Timon Wanga
(74) *Attorney, Agent, or Firm* — Moser Taboada; Alan Taboada

(57) ABSTRACT

Shutter disk assemblies for use in process chambers to protect a substrate support disposed below the shutter disk assembly from undesired material deposition are provided herein. In some embodiments, a shutter disk assembly for use in a process chamber to protect a substrate support disposed below the shutter disk assembly may include an upper disk member having a top surface and a bottom surface; and a lower carrier member having at least a portion of the lower carrier member disposed below a portion of the upper disk member to support the upper disk member and to create a protective overlap region that prevents exposure of the substrate support upon deformation of the upper disk member.

19 Claims, 3 Drawing Sheets

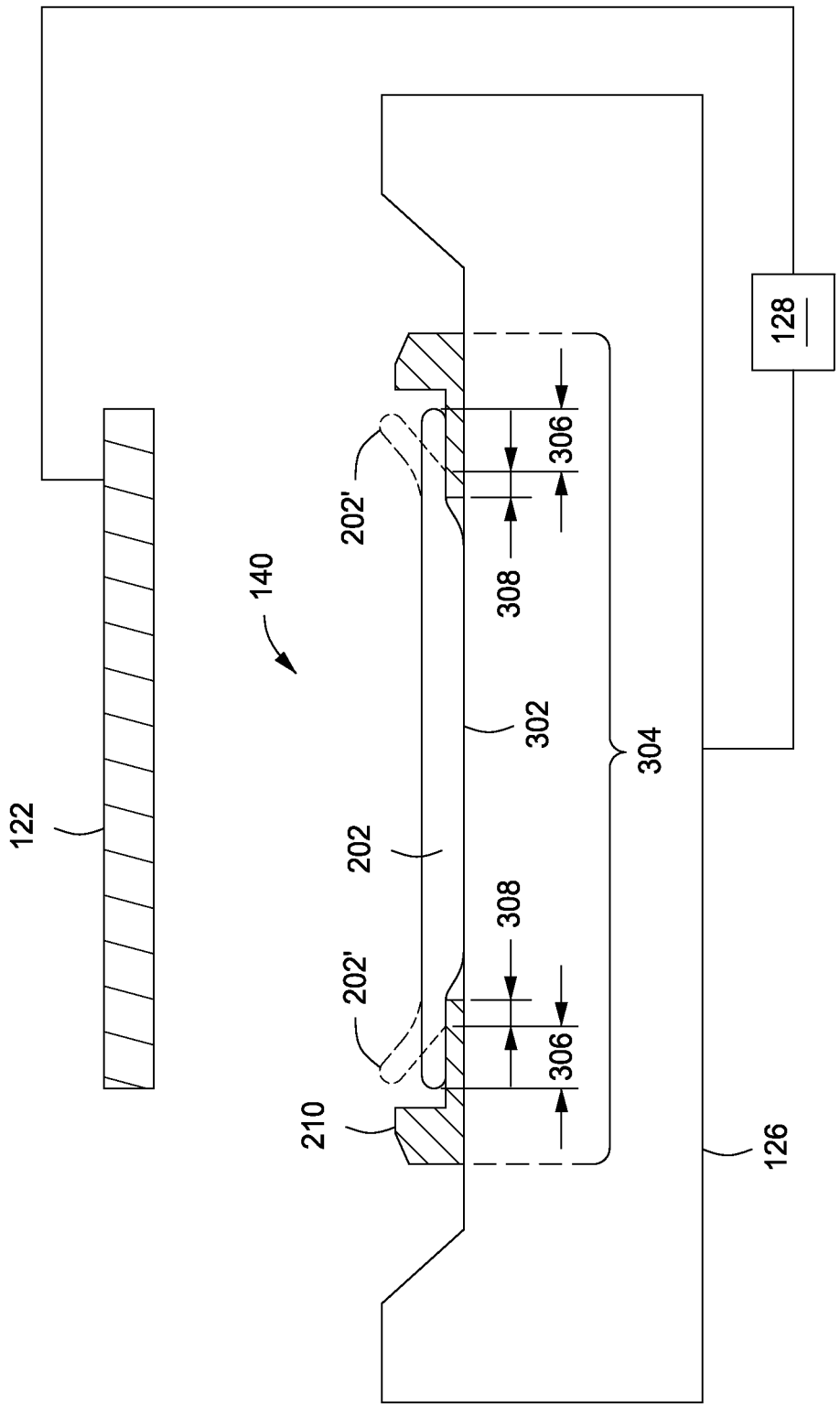

TWO PIECE SHUTTER DISK ASSEMBLY FOR A SUBSTRATE PROCESS CHAMBER

FIELD

Embodiments of the present invention generally relate to the field of substrate process chambers.

BACKGROUND

Conventional semiconductor device formation is commonly performed in one or more process chambers which have the capability to process substrates (e.g., semiconductor wafers) in a controlled processing environment. To maintain process uniformity and ensure optimal performance of the process chamber, various conditioning operations are periodically performed. For example, in a physical vapor deposition (PVD) process chamber, one commonly used conditioning operation is a "burn-in" process, wherein a target disposed in the PVD process chamber is bombarded with plasma ions to remove oxides or other contaminants from the target prior to performing substrate processes. Another commonly used conditioning operation is a "pasting" process, wherein a covering is applied over material deposited on process chamber surfaces to prevent the material from flaking off the process chamber surfaces and contaminating the substrate during subsequent processes.

In both of the aforementioned conditioning operations, a shutter disk may be positioned via a transfer robot atop a substrate support disposed in the process chamber to prevent the deposition of any materials upon the substrate support. The shutter disk typically comprises a material having a mechanical stiffness sufficient enough to resist deformation due to the additional weight of the deposited material. For example, the shutter disk commonly comprises a metal alloy, such as stainless steel, or a ceramic, such as silicon carbide.

However, the inventors have observed that during a pasting process, the shutter disk heats up. Due to heat gradient and/or deposition on the disc, the shutter disk may develop stresses from a thermal mismatch between the top and bottom surfaces of the shutter disk, for example, causing the shutter disk to deform (e.g., bow up at the ends). This deformation creates a gap which results in plasma exposure to the substrate support through the gap. Metal deposition on the substrate support could lead to substrate wafer arcing, substrate wafer sticking and/or breaking, electrostatic chucking force reduction if the substrate support is an electrostatic chuck, etc.

In addition, shutter disks are often stored clear of the processing area and moved by buffer chamber robots into a desired position during use. In order for the robots to be able to handle the disks, the weight and thickness of shutter disks must be minimized. These lighter weight/lower thickness shutter disks deform more during the pasting and burn-in processes.

Various solution have been tried to address the aforementioned problems. For example, use of lower RF powers, longer cooling periods, and addition of a cooling gas to the backside of a shutter disk have been tried. However, the inventors have observed that none of these solutions sufficiently protected the substrate support from undesired material deposition.

Accordingly, improved shutter disk assemblies are provided herein.

SUMMARY

Shutter disk assemblies for use in process chambers to protect a substrate support disposed below the shutter disk assembly from undesired material deposition are provided herein. In some embodiments, a shutter disk assembly for use in a process chamber to protect a substrate support disposed below the shutter disk assembly may include an upper disk member having a top surface and a bottom surface; and a lower carrier member having at least a portion of the lower carrier member disposed below a portion of the upper disk member to support the upper disk member and to create a protective overlap region that prevents exposure of the substrate support upon deformation of the upper disk member.

In some embodiments, a shutter disk assembly for use in a process chamber to protect a substrate support disposed below the shutter disk assembly may include an upper disk member having a top surface and a bottom surface, wherein the upper disk member further includes a stepped feature disposed about an outer diameter of the upper disk member; and a lower carrier member having a central opening and an inwardly extending annular ledge defining the central opening, wherein annular ledge is sized to support the upper disk member at the stepped feature.

In some embodiments, a process chamber may include a chamber body defining an inner volume having a target comprising materials to be deposited atop a substrate disposed therein; a substrate support disposed within the chamber body for supporting the substrate; a shutter disk assembly for protecting the substrate support, the shutter disk comprising an upper disk member having a top surface and a bottom surface and a lower carrier member having at least a portion of the lower carrier member disposed below a portion of the upper disk member to support the upper disk member and to create a protective overlap region that prevents exposure of the substrate support upon deformation of the upper disk member; and a transfer robot movably coupled to the chamber body for transferring the shutter disk assembly to and from the substrate support.

Other embodiments and variations of the present invention are disclosed in greater detail below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIG. 3 depicts an exemplary two piece shutter disk assembly used in conjunction with a substrate support.

Figure 1:
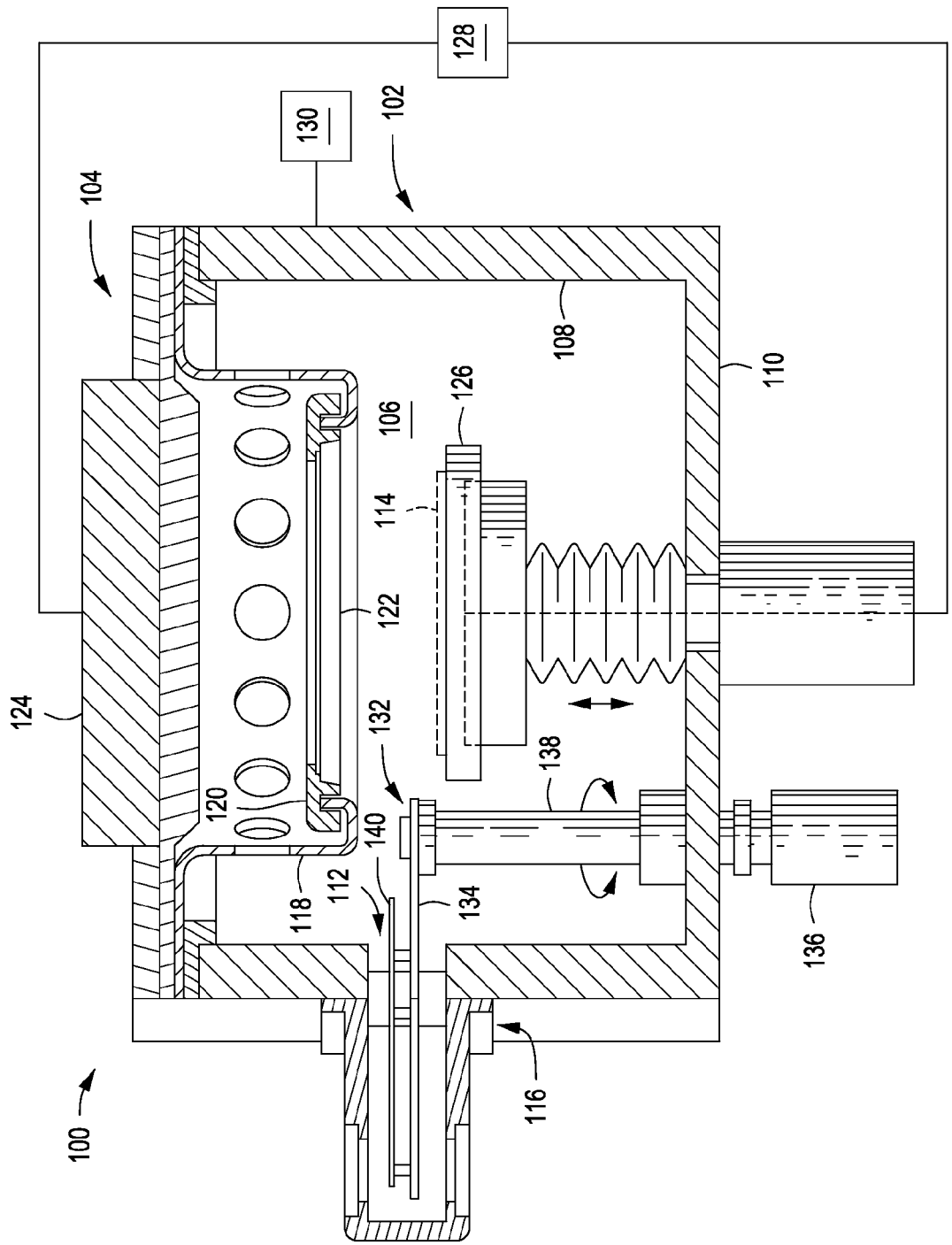
FIG. 1 is a schematic diagram of an exemplary process chamber suitable for use in connection with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to shutter disk assemblies for use in substrate process chambers, such as, for example, semiconductor manufacturing process chambers, and to substrate process chambers incorporating such shutter disk assemblies. In some embodiments, the inventive apparatus includes a shutter disk assembly for use in conditioning and cleaning operations of process chambers. The inventive apparatus may advantageously provide a shutter disk assembly that manages disk expansion due to heating during use with reduced or eliminated exposure of the substrate support upon which the shutter disk assembly is disposed, thereby protecting the substrate support disposed below the shutter disk assembly from undesired material deposition.

FIG. 1 is a schematic diagram of an exemplary process chamber 100 for use in connection with some embodiments of the present invention. In some embodiments, the process chamber 100 may be one of a plurality of chambers combined to form a multi-chamber processing system (e.g., a cluster tool). Alternatively, the process chamber 100 may be a standalone process chamber. In some embodiments, the process chamber 100 may be a deposition chamber, for example, a physical vapor deposition (PVD) chamber. Alternatively, the process chamber 100 may be any suitable process chamber in which a shutter disk assembly may be used to protect the substrate support from damage during chamber cleaning and or seasoning processes.

The process chamber 100 includes a chamber body 102 and a lid assembly 104 that defines an evacuable process volume 106. The chamber body 102 generally includes one or more sidewalls 108 and a bottom 110. The one or more sidewalls 108 may be a single circular sidewall or multiple sidewalls in process chambers having non-circular configurations. The sidewalls generally contain a shutter disk assembly port 112. The shutter disk assembly port 112 is configured to allow at least a portion of a shutter disk assembly 140 therethrough when the shutter disk assembly 140 is in a retracted position. A housing 116 generally covers the shutter disk assembly port 112 to maintain the integrity of the vacuum within the process volume 106. Additional ports may be provided in the sidewalls, such as a sealable access port to provide for the entrance and egress of the substrate 114 from the process chamber 100. A pumping port may be provided in the sidewalls and/or the bottom of the chamber body 102 and is coupled to a pumping system that evacuates and controls the pressure within the process volume 106. In other embodiments, a shutter garage (not shown) located outside of process chamber 100 may store the shutter disk assembly 140 and move it into process chamber 100 through an opening (not shown) in process chamber 100.

The lid assembly 104 of the chamber body 102 generally supports an annular shield 118 that supports a shadow ring 120. The shadow ring 120 is generally configured to confine deposition to a portion of the substrate 114 exposed through the center of the shadow ring 120. The lid assembly 104 generally comprises a target 122 and a magnetron 124.

The target 122 provides material that is deposited on the substrate 114 during the deposition process while the magnetron 124 enhances uniform consumption of the target material during processing. The target 122 and substrate support 126 are biased relative each other by a power source 128. An inert gas, for example, argon, is supplied to the process volume 106 from a gas source 130. A plasma is formed between the substrate 114 and the target 122 from the gas. Ions within the plasma are accelerated toward the target 122 and cause material to become dislodged from the target 122. The dislodged target material is attracted towards the substrate 114 and deposits a film of material thereon.

The substrate support 126 is generally disposed on the bottom 110 of the chamber body 102 and supports the substrate 114 during processing. A shutter disk assembly mechanism 132 is generally disposed proximate the substrate support 126. The shutter disk assembly mechanism 132 generally includes a blade 134 that supports the shutter disk assembly 140 and an actuator 136 coupled to the blade 134 by a shaft 138 to control the position of the blade 134.

The blade 134 may be moved between the retracted, or cleared position shown in FIG. 1 and a second position that places the shutter disk assembly 140 substantially concentric with the substrate support 126. In the second position, the shutter disk assembly 140 may be transferred (by utilizing the lift pins) to the substrate support 126 during the target burn-in and chamber pasting processes. The blade 134 is returned to the retracted position during the target burn-in and chamber pasting processes. The actuator 136 may be any device that may be adapted to rotate the shaft 138 through an angle that moves the blade 134 between the cleared and second positions. In other embodiments consistent with present invention, a robotic mechanism which positions a substrate 114 for processing may also be used to move the shutter disk assembly 140 in position to protect the substrate support 126.

Figure 2A:
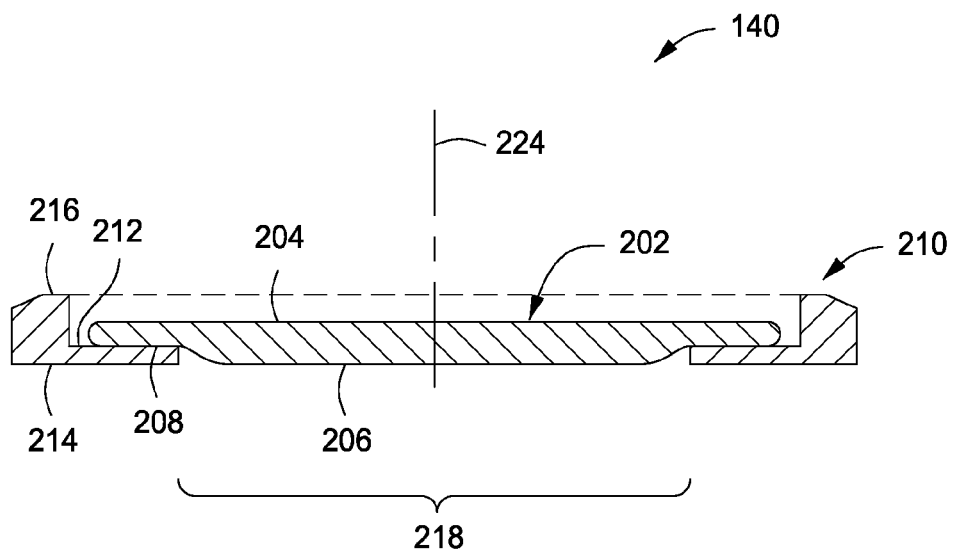
FIG. 2A depicts a partial cross sectional view of an exemplary two piece shutter disk assembly, in accordance with some embodiments of the present invention.
Figure 2B:
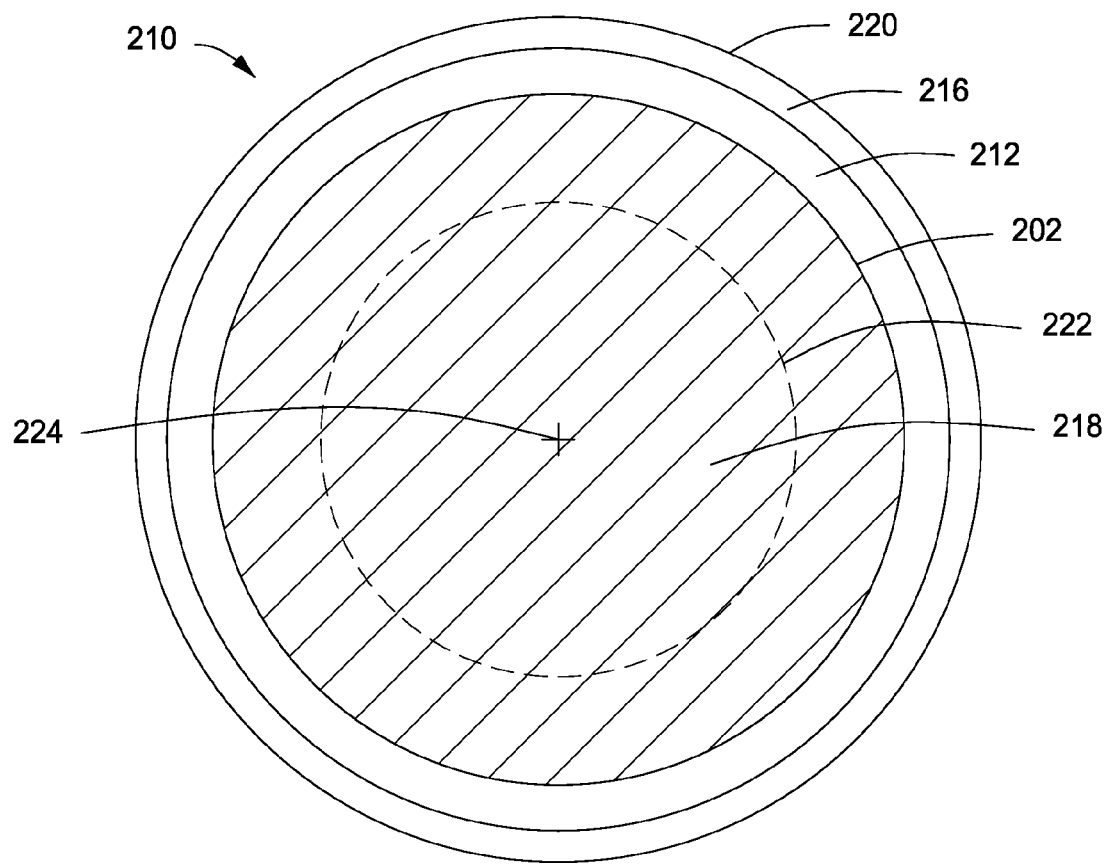
FIG. 2B is a top view of an exemplary two piece shutter disk assembly in accordance with some embodiments of the present invention.

FIG. 2A depicts a cross sectional side view of an exemplary shutter disk assembly 140 in accordance with some embodiments of the present invention. FIG. 2B is a top view of the exemplary shutter disk assembly of FIG. 2A, in accordance with some embodiments of the present invention. To best understand the invention, the reader should refer simultaneously to FIGS. 2A and 2B.

Exemplary shutter disk assembly 140 generally comprises an upper disk member 202 and a lower carrier member 210. Although described herein as a two piece assembly, the shutter disk assembly may include additional components. In addition, although described herein as a disk, the shutter disk assembly and its components may have any suitable geometry as required for protecting a substrate support within a particular process chamber.

The lower carrier member 210 and the upper disk member 202 are movably disposed or coupled with respect to each other such that the lower carrier member 210 and the upper disk member 202 may move in relation to each, for example, to allow for independent thermal expansion and contraction of the components. In some embodiments, the upper disk member 202 may merely rest upon the lower carrier member 210.

The lower carrier member 210 supports the upper disk member 202. In some embodiments, the lower carrier member 210 may be a ring which includes a first feature 212, such as an inwardly extending ledge, to support the upper disk member 202 such that a bottom side 206 of the upper disk member 202 is disposed over a central opening 218, having a diameter 222, of the lower carrier member 210. Although a ledge is depicted in FIG. 2A to support the upper disk member 202, the first feature 212 may also be a chamfer, a protrusion, or other suitable feature to support the upper disk member 202. In embodiments consistent with FIG. 2A, the bottom surface of the lower carrier member 210 and the bottom surface of the upper disk member define a substantially planar surface which contacts, and is supported by, substrate support 126. In other embodiments, only the lower carrier member 210 is in contact with substrate support 126, which may be used to control/change RF coupling. In some embodiments consistent with the present invention, the size of central opening 218 in the lower disk member may be optimized based on the structural support required, RF coupling required, thermal conductivity, etc.

In some embodiments, the carrier member 210 may not be a ring, and may support upper disk member 202 along the entire bottom surface 206 of upper disk member 202. For example, in some embodiments the lower carrier member may be a solid disk (not shown) with no central opening, similar to upper disk member 202.

The carrier member 210 may also include a second feature 216 which assists in positioning the upper disk member 202 and keeping the upper disk member 202 generally in place (e.g., from sliding out of position) while still allowing the upper disk member 202 to move or deform, for example, due to thermal expansion and contraction. For example, in some embodiments, the second feature 216 may be a protrusion or lip extending upward from the carrier member to define a recess in which the upper disk member 202 may be disposed. Alternatively or in combination, in some embodiments, the second feature may be a pin which couples the upper disk member 202 and the lower carrier member along centerline 224, while still allowing the upper disk member 202 to radially move or deform with respect to lower carrier member 210, for example, due to thermal expansion and contraction.

The lower carrier member 210 may comprise a thermally stable material to minimize thermal deformation of the lower carrier member 210. For example, lower carrier member 210 may comprise at least one of ceramic, silicon carbide coated graphite, solid silicon carbide, solid sintered silicon carbide, or solid sintered silicon carbide fabricated with metal-free sintering agents, such as PUREBETA®, available from Bridgestone, or the like. In some embodiments, the lower carrier member 210 may comprise a material with a coefficient of thermal expansion of about 5.6E-6 m/m K to about 22.2E-6 m/m K. In some embodiments, the lower carrier member 210 may comprise a thermally conductive material. In some embodiments, the lower carrier member 210 may comprise an electrically insulating material. In any of the embodiments described above, the lower carrier member 210 may be constructed of suitable materials having a mechanical stiffness sufficient enough to substantially resist deformation due to the additional weight of the upper disk member 202 and materials which may be deposited atop the upper disk member 202 during use. In some embodiments, the material may also be lightweight so as to allow the shutter disk assembly 140 to be easily maneuvered by a transfer robot. In some embodiments, one or more surfaces of the lower carrier member 210 and/or the upper disk member 202 which are in contact with each other may be finished in such a way to facilitate ease of movement due to thermal deformation between the lower carrier member 210 and the upper disk member 202.

In some embodiments, the bottom surface 214, the bottom surface of the lower carrier member 210 may be substantially planar. In other embodiments, the bottom surface 214 of the lower carrier member 210 may comprise features to interface with the components of the shutter disk assembly mechanism 132 to facilitate stable and precise movement. Exemplary shutter disk features used to interface with components of a shutter disk assembly mechanism are described, for example, in U.S. patent application Ser. No. 12/542,501, filed Aug. 17, 2009, and entitled "SHUTTER DISK HAVING A TUNED COEFFICIENT OF THERMAL EXPANSION".

The top surface 204 of the upper disk member 202 is generally planar and has an orientation substantially perpendicular to the centerline 224 of shutter disk assembly 140. The bottom surface 206 is also generally planar and has an orientation substantially perpendicular to the centerline 224 of shutter disk assembly 140. In some embodiments, the upper disk member 202 may include a step feature 208 that is substantially parallel to the bottom surface 206. As shown in FIG. 2A, in some embodiments the upper disk member 202 may be supported using step feature 208 by the first feature 212 of the lower carrier member 210.

The upper disk member 202 may be constructed of any suitable material having a mechanical stiffness sufficient enough to resist deformation due to the additional weight of materials which may be deposited atop the upper disk member 202. In some embodiments, the material may also be lightweight so as to allow the shutter disk assembly 140 to be easily maneuvered by a transfer robot. In some embodiments, the upper disk member 202 may be constructed from a metal alloy, such as stainless steel, a metal composite, such as aluminum silicon (AlSi), or a ceramic, such as silicon carbide. The upper disk member 202 may be fabricated via any method suitable for forming the desired shape, for example, mold casting, die casting, spray casting, spray deposition, or the like. In some embodiments, the upper disk member 202 is comprised of the same material used in the process chamber for depositing/etching substrates.

In some embodiments, shutter disk assembly 140 has an outer diameter 220 of about 6 to about 12 inches, for example about 6, 8, or 11.85 inches. In some embodiments, the thickness from the of the top surface 204 of the upper support disk 202 to the bottom surface of the lower support carrier 214 may be about 0.1 to about 0.25 inches, for example, about 0.15 inches. Other sizes may be used depending upon the configuration and size of the substrate support. In some embodiments, the shutter disk assembly 140 will have an outer diameter 220 equal to that of a diameter of substrate 114 with a tolerance of +/−50 mm. Although discussed in terms of diameters and referred to as a disk, the shutter disk assembly 140 and the upper disk member are not limited to round shapes and may have any shape suitable for use in a process chamber as disclosed herein. Although discussed in terms of diameters and the terms "ring" or "disc" may be used to describe the shutter disk assembly and components thereof, it is contemplated that the shape of the shutter disk assembly and these components need not be circular and may have a perimeter and/or opening of any shape, including but not limited to, rectangles, polygons, ovals, and the like.

FIG. 3 depicts an exemplary shutter disk assembly 140 and substrate support 126 consistent with at least some embodiments of the present invention. Shutter disk assembly mechanism 132 may place shutter disk assembly 140 into position on substrate support 126. The portion of substrate support 126 that shutter disk assembly 140 protects is shown as protected support surface 304. In some embodiments, the lower carrier member 210 of shutter disk assembly 140 may be supported by a top surface 302 of substrate support 126. In addition, the bottom surface of upper disk member 202 may be positioned proximate to, or in physical contact with, the top surface 302 of substrate support 126. In some embodiments, a nominal gap disposed between upper disk member 202 and substrate support 126 is about 0.04 inches. In other embodiments, upper disk member 202 can be in contact with substrate support 126 for heat transfer or other reasons.

As discussed above, the target 122 and substrate support 126 are biased relative each other by a power source 128. During a pasting process, for example, the shutter disk assembly heats up due to plasma power (RF or DC source). In some embodiments where the lower carrier member 210 is a ring, the power couples directly from substrate support 126 to upper disk member 202. Other embodiments where the lower carrier member 210 is a solid disk, the power first couples directly from substrate support 126 to lower carrier member 210, and then to the upper disk member 202 As upper disk member 202 heats up, it begins to deform and move with respect to lower carrier member 210 (as shown by deformed upper disk member 202'). However, the deformed upper disk member 202' and lower carrier member 210 still maintain an overlap region 308 which protects substrate support 126.

While the foregoing is directed to embodiments of the present invention, other and further embodiments of the invention may be devised without departing from the basic scope thereof, and the scope thereof is determined by the claims that follow.

What is claimed is:

1. A shutter disk assembly, comprising:
    an upper disk member having a top surface and a bottom surface; and
    a lower carrier member having at least a portion of the lower carrier member disposed below a portion of the upper disk member to support the upper disk member and to create a protective overlap region that prevents exposure of a substrate support disposed below the shutter disk assembly upon deformation of the upper disk member,
    wherein the lower carrier member includes a first opening having a first diameter that extends partially into a body of the lower carrier member, and a second opening that extends through the body of the lower carrier member having a second diameter that is smaller than the first diameter, and wherein the upper disk member is disposed entirely within the first and second openings of the lower carrier member.

2. The shutter disk assembly of claim 1, wherein the lower carrier member is a ring having a central opening, and wherein the lower carrier member supports the upper disk member such that the bottom surface of the upper disk member is disposed over a central opening of the lower carrier member.

3. The shutter disk assembly of claim 2, wherein the lower carrier member further comprises:
    a first feature that supports the upper disk member; and
    a second feature that maintains the upper disk member in a position over the central opening of the lower carrier member.

4. The shutter disk assembly of claim 3, wherein the upper disk member includes a step feature disposed above the first feature of the lower carrier member, wherein the first feature supports upper disk member using the step feature.

5. The shutter disk assembly of claim 4, wherein the step feature of the upper disk member and the first feature of the lower carrier member form the protective overlap region.

6. The shutter disk assembly of claim 2, wherein a bottom surface of the lower carrier member and the bottom surface of the upper disk member are co-planar.

7. The shutter disk assembly of claim 2, wherein a first portion of the bottom surface of the upper disk member that is supported by the lower carrier member is at a same plane or higher than a second portion of the bottom surface of the upper disk member that is disposed over the central opening.

8. The shutter disk assembly of claim 1, wherein the lower carrier member comprises a thermally stable material with a coefficient of thermal expansion of about 5.4E-6 m/m K to about 22.2E-6 m/m K.

9. The shutter disk assembly of claim 1, wherein the lower carrier member comprises at least one of ceramic, silicon carbide coated graphite, solid silicon carbide, solid sintered silicon carbon, or solid metal-free sintered silicon carbide.

10. The shutter disk assembly of claim 1, wherein the upper disk member comprises an electrically conductive material.

11. The shutter disk assembly of claim 1, wherein the upper disk member comprises a metal or metal composite material.

12. A process chamber comprising the shutter disk assembly of claim 1, the process chamber further comprising:
    a chamber body defining an inner volume having a target comprising materials to be deposited atop a substrate disposed therein;
    a substrate support disposed within the chamber body to support the substrate; and
    a transfer robot movably coupled to the chamber body to transfer the shutter disk assembly to and from the substrate support.

13. The process chamber of claim 12, wherein the lower carrier member is a ring having a central opening, and wherein the lower carrier member supports the upper disk member such that the bottom surface of the upper disk member is disposed over a central opening of the lower carrier member.

14. The process chamber of claim 13, wherein the lower carrier member further comprises:
    a first feature that supports the upper disk member; and
    a second feature that maintains the upper disk member in a position over the central opening of the lower carrier member.

15. The process chamber of claim 14, wherein the upper disk member includes a step feature disposed above the first feature of the lower carrier member, wherein the first feature supports upper disk member using the step feature.

16. The process chamber of claim 15, wherein the step feature of the upper disk member and the first feature of the lower carrier member form the protective overlap region.

17. The process chamber of claim 13, wherein a bottom surface of the lower carrier member and the bottom surface of the upper disk member are co-planar.

18. The process chamber of claim 12, wherein the lower carrier member comprises at least one of ceramic, silicon carbide coated graphite, solid silicon carbide, solid sintered silicon carbon, or solid sintered silicon carbide sintered with metal-free sintering agents, and wherein the upper disk member comprises a metal or metal composite material.

19. A shutter disk assembly, comprising:
    an upper disk member having a top surface and a bottom surface, wherein the upper disk member further includes a stepped feature disposed about an outer diameter of the upper disk member; and
    a lower carrier member having a central opening and an inwardly extending annular ledge defining the central opening, wherein the annular ledge contacts and supports the upper disk member at the stepped feature, and wherein the lower carrier member includes a first opening having a first diameter that extends partially into a body of the lower carrier member, and a second opening that extends through the body of the lower carrier member having a second diameter that is smaller than the first diameter, and wherein the upper disk member is disposed entirely within the first and second openings of the lower carrier member.

* * * * *